United States Patent [19]
Fukuda

[11] Patent Number: 5,698,072
[45] Date of Patent: Dec. 16, 1997

[54] DRY ETCHING METHOD

[75] Inventor: Seiichi Fukuda, Kanagawa, Japan

[73] Assignee: Sony Corporation, Tokyo, Japan

[21] Appl. No.: 80,711

[22] Filed: Jun. 24, 1993

[30] Foreign Application Priority Data

Jun. 29, 1992 [JP] Japan ................. 4-194866

[51] Int. Cl.⁶ ............. H01L 21/302; H01L 21/28
[52] U.S. Cl. ................. 156/653.1; 156/661.11;
 156/656.1; 156/657.1; 156/652.1; 156/643.1
[58] Field of Search ............... 156/651.1, 652.1,
 156/653.1, 656.1, 657.1, 643.1, 646.1, 661.11;
 437/228

[56] References Cited

U.S. PATENT DOCUMENTS

| | | | |
|---|---|---|---|
| 5,118,387 | 6/1992 | Kadomura | 156/662.1 |
| 5,160,407 | 11/1992 | Latchford et al. | 156/656 |
| 5,160,408 | 11/1992 | Long | 156/656 |
| 5,354,417 | 10/1994 | Cheung et al. | 156/643.1 |
| 5,416,037 | 5/1995 | Sato | 437/52 |
| 5,431,770 | 7/1995 | Lee et al. | 156/653.1 |
| 5,491,100 | 2/1996 | Lee et al. | 437/41 |

FOREIGN PATENT DOCUMENTS

| | | |
|---|---|---|
| 1169945 | 7/1989 | Japan. |
| 4148534 | 5/1992 | Japan. |

*Primary Examiner*—R. Bruce Breneman
*Assistant Examiner*—George Goudreau
*Attorney, Agent, or Firm*—Hill, Steadman, & Simpson

[57] ABSTRACT

An object of this invention is to provide a dry etching method enabling a higher productivity and a higher yield without giving any bad effect to a substrate (such as, for instance, damages to a gate oxide film bed) even in a case where a side wall protection film is formed and then the side wall protection film must be removed later.

This invention is a dry etching method for processing a polycide layer, in which a poly Si layer and a refractory metal silicide layer are formed in this order on an oxide film bed, by etching resist patterns selectively formed on said polycide layer into a mask, wherein the undercut 6 is provided in the refractory metal silicide layer 2 or other layers contacting the resist pattern 1 and then the refractory metal silicide layer 2 and the poly Si layer 3 are isotropically etched.

16 Claims, 4 Drawing Sheets

DRY ETCHING METHOD

BACKGROUND OF THE INVENTION

1. Field of the Invention

This invention relates to a dry etching method, and particularly to a dry etching method for processing a polycide layer, in which a poly Si layer and a high melting point silicide layer are formed in this order on an oxide film bed, by etching resist patterns selectively formed on said polycide layer into a mask. This invention can be used, for instance, for producing materials available in the field of electronics (to manufacture semiconductor devices or others). This invention can be embodied, for instance, as a dry etching technology using a side wall protection film in manufacturing high speed/high density semiconductor devices.

2. Prior Art

In recent years, various types of materials for electronics having become more minute and higher in density. As can be observed in the examples of VLSIs and ULSIs recently developed, in association with introduction of more minute design rules for semiconductor devices or others, it has been becoming more and more important to etch a material layer under higher selectivity toward the bed.

For instance, when fabricating a gate electrode for MOSFET, it is necessary to etch a silicon-based material layer such as a polycrystal silicon layer or a polycide film under the conditions where a high selectivity ratio to a thin gate insulating film made of silicon oxide ($SiO_2$) can be achieved.

Also, when forming a contact in such a section as an impurities diffusing area formed in a semiconductor substrate, or a source drain area of a PMOS transistor, it is necessary to etch an insulating film between $SiO_2$ layers under the conditions where a high selection ratio to such Si-based materials as a silicon substrate or a poly-silicon layer can be achieved.

However, such conditions as selectivity to a substrate, anisotropy etching speed, low polluting characteristics, low damaging characteristics are related to each other in a trade-off relationship so that etching is carried out in actual processes appropriately adjusting the conditions in a range allowable for the actual operations.

Conventionally for etching layers made of Si-based materials such as monocrystalline silicon, polycrystalline silicon, refractory metallic silicide having a high melting point or polycide, a Freon (chlorofluorocarbon) -based gas represented by, for instance, Freon 113 ($C_2Cl_3F_3$) is widely used as an etching gas. It is because the Freon-based gas has F and Cl as constituting elements in one molecule that etching due to both the radical reaction and the ion assist reaction can be carried out, and also a high anisotropy can be achieved while protecting the side walls with a carbon-based polymer deposited from the gas phase.

It has been pointed out, however, that the Freon-based gas, which is a representative etching gas adding to the layers made of Si-based materials, is widely considered as for destruction of the ozone layer around the earth, and it is expected that production and use of the materials will be prohibited in the near future. For this reason, now many efforts are made for development of other etching gasses which are available as alternatives to these sedimentary carbon-based gasses as well as for development of technologies enabling use of the alternative etching gasses to be developed in the future. For instance, the etching technology with a bromine gas ($Br_2$) or a hydrogen bromide-based gas (HBr) has been developed (Refer to, for instance, the Japanese Patent Laid Open Publication No.89310/1990).

In etching layers made of Si-based materials with a hydrogen bromide-based gas, side wall protection is carried out by a product from a reaction between photoresist and Br, or between Si and Br. Also in over-etching where the priority is put on the selectivity to substrate, the anisotropy, having a trade-off relation with the selectivity to substrate, becomes lower. For this reason, sometimes etching may be carried out under process conditions compensating decrease of anisotropy by using a more effective side wall protection film such as, for instance, a $SiO_2$ film.

On the other hand, when an etching process ends, usually a resist layer used as an etching mask must be removed by means of ashing with an oxygen ($O_2$) gas plasma. Then the side wall protection film used in etching a layer made of Si-based materials is also deposited on a side wall of the resist layer as a mask, only this side wall protection film, which can not be removed by the oxygen gas plasma, may remain in a belt-shaped area even after the resist layer has been removed by means of ashing.

As the side wall protection film left in the belt-shaped area adversely affects such factors as flatness of inter-layer films stacked in the subsequent processes, it must be removed before the inter-layer films are stacked. In the conventional technology, after anisotropic processing making use of a side wall protection film is carried out, said side wall protection film is removed by means of wet etching with fluoric acid solution, but in case of wet etching with fluoric acid solution, the gate oxide film bed is simultaneously etched. This does not cause any specific problem if the minimum processing line width is fully large and also the gate oxide film bed is fully thick, but recently as the gate oxide film bed has been becoming thinner and thinner with increasing speed in association with technological advance in this field, this gives some influences over gate oxide film bed to be etched, and sometimes the gate oxidized film bed is damaged.

SUMMARY OF THE INVENTION

This invention was made to solve the problems as described above, and an object of this invention is to provide a dry etching method enabling a higher productivity and a higher yield without damaging the substrate, namely, for instance, the gate oxide film bed, or minimizing damages even in cases where it is necessary to form a side wall protection film first and then remove it later.

One aspect of the present invention which aims at achieving the aforementioned object is a dry etching method for processing a polycide layer, in which a poly Si layer and a refractory metal silicide layer are formed in this order on an oxide film bed, by etching resist patterns selectively formed on said polycide layer into a mask; characterized in that an undercut is provided in the aforesaid refractory metal silicide layer which contacts the aforesaid resist patterns and then the aforesaid refractory metal silicide and the aforesaid poly Si side are anisotropically etched.

Another aspect of the present application which aims at achieving the aforesaid object is a dry etching method for processing a polycide layer, in which a poly Si layer and a refractory metal silicide layer are formed in this order on an oxide film bed, by etching resist patterns selectively formed on said polycide layer into a mask; characterized in that a polycide thin layer containing impurities at a high density is formed on the aforesaid refractory metal silicide layer, and an undercut is provided in the aforesaid polycide thin layer containing impurities at a high density, and then the aforesaid refractory metal silicide layer and the aforesaid poly Si layer are anisotropically etched Another aspect of the present invention which aims at achieving the aforesaid object is a dry etching method comprising a step of forming a resist pattern 1 on a semiconductor wafer having a construction in which an oxide film as a gate oxide film bed is formed on a Si substrate with a poly Si layer and a refractory metal metal silicide layer is formed on said film to form a poly-side layer as a whole, a step of carrying out a first step etching with an ECR plasma etching system to intentionally provide an undercut in a portion corresponding to a section beneath the resist pattern which is a mask of the refractory metal Si side layer, the etching conditions then including use of a gas with a strong isotropic mode and a low RF, a step of carrying out a second step etching and a third step etching, which is over-etching, by anisotropically processing the remaining refractory metal silicide layer and the poly Si layer and at the same time under the condition where an appropriate selection ratio is secured during over-etching to remove the resist pattern processes into a mask, and a final step of cleaning and drying the semiconductor wafer using a spin cleaning equipment based on a spray system or a cleaning equipment based on a dip system, and aims at achieving the aforesaid object with the method as described above. Another aspect of the invention is a dry etching method as claimed in claim 3 wherein the gas used in the first etching is $SF_6$. Another aspect of the present invention which aims at achieving the aforesaid object is a dry etching method wherein the gas used in the second step etching is $SF_6/HBr.Cl_2/O_2$, or $Cl_2/HBr$.

Another aspect of the invention as claimed in claim 6 is a dry etching method wherein the gas used in the third step etching is $C_2/HBr$.

Another aspect of the invention which aims at achieving the aforesaid object is a dry etching method for processing a polycide layer, in which a poly Si layer and a refractory metal silicide layer are formed in this order on an oxide film bed, by etching resist patterns selectively formed on said polycide layer; characterized in that side wall protection films to achieve anisotropic etching are formed on a side face of the layer to be etched and on a side face of the layer with resist patterns formed thereon and a first side wall protection film formed on the side face of the layer to be etched and a second side wall protection film formed on a side face of the layer with resist patterns formed thereon are separated at a point of time when etching ends.

Another aspect of the invention in this application which aims at achieving the aforesaid object is a dry etching method for processing a polycide layer, in which a poly Si layer and a refractory metal silicide layer are formed in this order on an oxide film bed, by etching resist patterns selectively formed on said polycide layer; characterized in that side wall protection films to achieve anisotropic etching are formed on a side face of the layer to be etched and on a side face of the layer with resist patterns formed thereon, and a first side wall protection film formed on the side face of the layer to be etched and a second side wall protection film formed on a side face of the layer with resist patterns formed thereon are separated at a point of time when etching ends, and also that the side wall protection films are removed after etching ends.

Another aspect of the invention which aims at achieving the aforesaid object is a dry etching method wherein a poly Si layer 8 film with impurities doped at a higher density as compared to that in a lower layer, is formed on the top layer on which a gate electrode is formed so that an undercut is easily generated on the top layer in dry-etching a gate electrode.

Another aspect of the invention which aims at achieving the aforesaid object is a dry etching method comprising steps of forming an oxide film bed by thermally oxidizing a Si substrate, forming an $n^+$ poly Si layer 3 on said gate oxide film bed with an LPCVD system, forming a refractory metal silicide layer on the gate oxide film bed/$n^+$ poly Si layer, forming a top poly Si layer with impurities doped at a higher density as compared to that in a lower poly Si layer after forming the aforesaid gate oxide film bed, lower poly Si layer and silicide layer, then forming a photoresist pattern on the top poly Si layer with impurities doped at a higher density, dry-etching the top poly Si layer 8 with an ECR plasma etching system to form an undercut therein, etching the silicide layer and the lower poly Si layer changing the etching conditions after etching the aforesaid top poly Si layer containing impurities at a higher density, and furthermore removing a photoresist mask by ashing with a plasma ashing system after over-etching a step section, and finally cleaning with pure water and drying the semiconductor wafer.

Another aspect of the invention in this application which aims at achieving the aforesaid object is a dry etching method characterized in that removal of the side wall protection method is carried out according to the ashing technology.

Another aspect of the invention in this application which aims at achieving the aforesaid object is a dry etching method characterized in that removal of the side wall protection method is carried out by means of cleaning with water.

Another aspect of the invention which aims at achieving the aforesaid object is a dry etching method characterized in that the portion to be etched has a stacking structure got forming a silicon-based electrode layer.

BRIEF DESCRIPTION OF THE INVENTION

According to the invention in this application, an undercut is provided in a refractory metal silicide layer, an undercut is provided, for instance, in the upper section of the refractory metal silicide layer, and an undercut is provided in a polycide layer containing impurities at a high density, and for this reason even if etching is carried out to obtain an excellent etching state under the conditions for forming a side wall protection film, a side wall protection film deposited on a side wall portion of a resist mask is separated from a side wall protection film deposited on a side wall portion (for instance, a gate electrode) of a section to be etched, so that removal thereof can quite easily be carried out without requiring, for instance, wet etching with a fluoric acid solution, and a side wall protection film deposited on a side wall of a resist mask, which is troublesome in subsequent processes, can easily be removed by means of, for instance, washing the portion with water. As a result, damages given to the substrate are much reduced, and at the same time the productivity and the yield are much raised.

With this invention, it is possible to provide a dry etching method without giving bad effects to a substrate, namely without giving any damage to, for instance, a gate oxidized film, or with damages thereto minimized even in cases where a side wall protection film is formed for etching in a good state and then said side wall protection film must be removed.

DETAILED DESCRIPTION OF THE PREFERRED EMBODIMENTS

Detailed description is made hereinafter for preferred embodiments of this invention with reference to the related drawings. It is needless to say that the preferred embodiments are provided only for the purpose of description and this invention is not limited by the embodiments in any sense.

Embodiment 1

In this embodiment, the invention in this application is applied to a case of forming a gate electrode by means of etching a polycide layer formed on a gate oxidized film. More particularly, this invention is embodied in a case of processing and forming gate electrodes in fine and high density semiconductor devices.

Figure 1A:
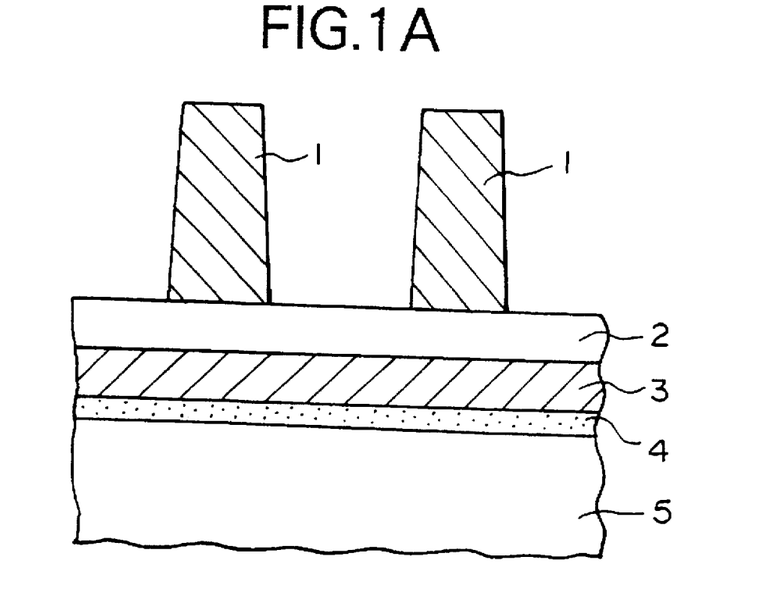
FIG. 1A–FIG. 1D is a drawing illustrating a sequential order of processes in the embodiment 1, and FIG. 2A
Figure 1B:
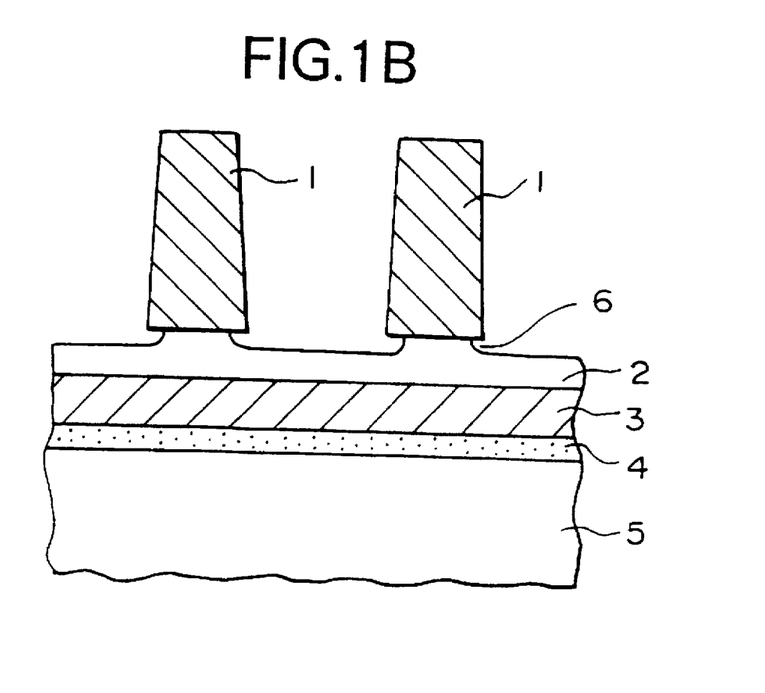
Figure 1C:
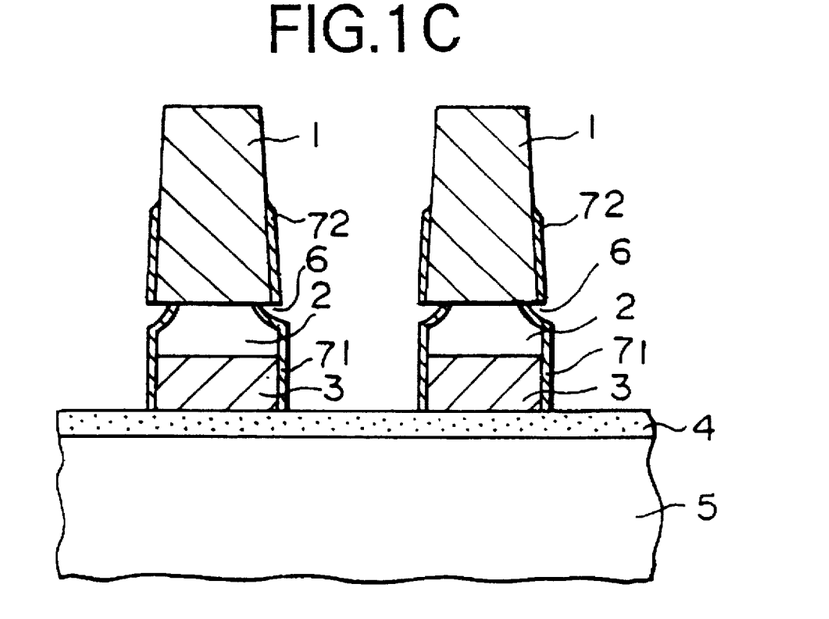
Figure 1D:
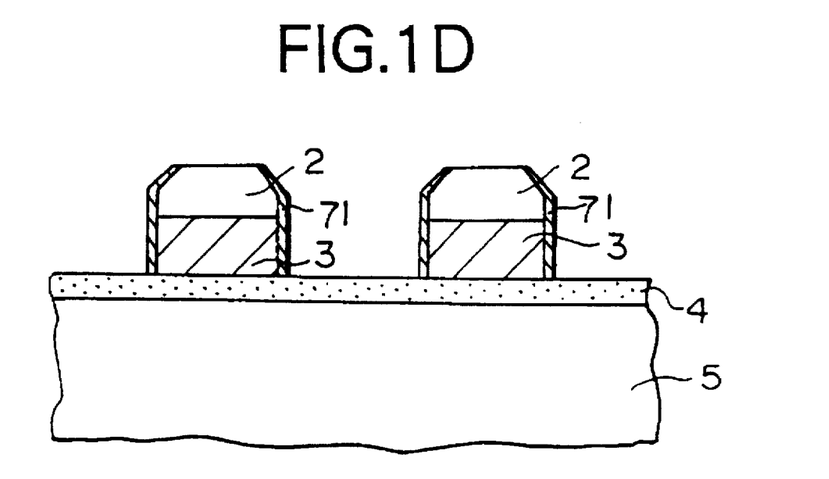

In this embodiment, as shown in FIG. 1A–1D illustrating a process after polycide etching (a latter half of a production process), in processing a polycide layer, in which a poly Si layer 3 and a refractory metal silicide layer 2 (WSix layer in this embodiment) are formed in this order on an oxide film bed 4 (gate oxide film bed in this embodiment), by etching resist patterns 1 selectively formed on said polycide layer into a mask, the construction as shown in FIG. 1D is obtained by providing an undercut 6 in the refractory silicide layer 2 contacting the resist pattern 1 and carrying out anisotropic etching in the refractory metal silicide layer 2 and the poly Si layer 3 as shown in FIG. 1C.

Also, this embodiment, as shown in FIG. 1A–1D, is a dry etching method for processing a polycide layer, in which a poly Si layer 3 and a refractory metal silicide layer 2 are formed in this order on an oxide film bed 4, by etching resist patterns 1 selectively formed on said polycide layer into a mask, wherein side wall protection films 7 for achieving anisotropic etching are formed on side faces of the layers 2 and 3 to be etched and at the same time a first side wall protection film 71 formed on the side faces of the layers 2 and 3 to be etched and a second side wall protection film 72 formed on a side face of the resist pattern 1 are separated at a point of time when the etching process ends as shown in FIG. 1C. It should be noted that the side wall protection films 7, 71 and 72 are shown somewhat exaggeratedly to illustrate the embodiment clearly.

More particularly, the desired etching was carried out in this embodiment through the following processes.

As shown in FIG. 1A, a resist pattern I was formed according to a specified patterning on a semiconductor wafer having the construction wherein the oxide film bed 4 ($Si_2O$) functioning as a gate oxide film bed was formed on a Si substrate 5 and the poly Si layer 3 and the refractory metal silicide layer 2 (tungsten silicide layer) were formed thereon to form a polycide layer.

This was isotropically etched, as shown in FIG. 1B, with an ECR plasma etching system. With this operation, an undercut 6 was intentionally arranged in a section under the resist pattern 1 which was a mask for the refractory metal silicide layer 2. Etching was carried out using a gas having a relatively high isotropic mode under low RF and under the following etching conditions.

(First step etching)
$SF_6$=50 sccm
RF: 20 W
Pressure: 1.3 Pa
μ wave power: 850 W
Stage temperature: 20° C.

Then etching was carried out, as shown in FIG. 1C, by anisotropically processing the refractory metal silicide layer 2 (WSix layer) and the poly Si layer 3 still remaining there under the conditions where an appropriate selection ratio was maintained during over-etching. Etching was carried out in 2 steps under the following conditions.

(Second step etching)
$SF_6$/HBr=20/30 sccm
RF power: 100 W
Pressure: 1.3 Pa
μ wave power: 850 W
State temperature: 20° C.

This second step etching is carried out up to just etching.

(Third step etching)
$O_2$/HBr=5/45 sccm
RF power: 30 W
Pressure: 1.3 Pa
μ wave power: 850 W
Stage temperature: 20° C.

This third step etching is over-etching.

Finally, the resist pattern used as a mask is removed by means of $O_2$ plasma ashing, and the construction shown in FIG. 1D is obtained.

The final cleaning step is carried out with a cleaning equipment based on a spray system or a cleaning equipment based on a dip system, and then the product is dried.

De-ionized water can be used for cleaning, and also an ultrasonic cleaning equipment can be used for the same purpose. With this feature, a side wall protection film can be removed without giving any bad effect such as damages to the substrate.

In the second step etching described above, in addition to $SF_6$ and HBr, also such gasses as $Cl_2$ or $O_2$ can be used.

Of the gasses used in the third step etching, $O_2$ prevents undercuts in the polycide layer 3, while HBr insures a selection ratio to the oxide film 4.

Embodiment 2

Also in this embodiment, isotropic etching is carried out using a semiconductor wafer with a film forming and patterning carried out as shown in FIG. 1A, but in a chamber of a medium/low temperature multi-chamber ECR plasma etching system under the peripheral temperature, as shown in FIG. 1B. With this, an undercut 6 is intentionally formed in the silicide layer 2 (WSi layer) under the resist pattern 1. The etching conditions in this embodiment are as follows.

(First step etching)
$SF_6$=50 sccm
RF: 20 W
Pressure: 1.3 Pa
μ wave power: 850 W
Stage temperature: 20° C.

Then in order to anisotropically process the silicide layer 2 and the poly Si layer 3, the wafer to be etched is transferred to the chamber with the stage cooled therein, and etching is carried out up to over-etching under the following conditions.

(Second step etching)
Cl$_2$/HBr=30/20
RF: 1.3 Pa
Pressure: 1.3 Pa
μ wave power: 850 W
Stage temperature: −30° C.

Finally, the resist pattern is removed as in embodiment 1, and then the product is cleaned and dried.

Also in this embodiment, a side wall 7 (71,72) is used in both main etching and over-etching like in the embodiment 1, but the undercut 6 is intentionally formed under the resist in the step 1, so that the side wall protection film can be removed without being left in a rectangular form in the side wall of the resist after the product is cleaned and dried.

Embodiment 3

This embodiment, as shown in FIG. 2A–2D, is a dry etching method for processing a polycide layer, in which a poly Si layer 3 and a refractory metal silicide layer 2 are formed in this order on an oxide film bed 4, by etching resist patterns 1 selectively formed on said polycide layer into a mask, wherein a polycide thin layer 8 containing impurities at a high density is formed in the upper section of the refractory metal silicide layer 2, the undercut 6 is provided in said polycide layer 8 containing impurities at a high density, and then the refractory metal silicide layer 2 and the poly Si layer 3 are anisotropically etched.

Figure 2A:
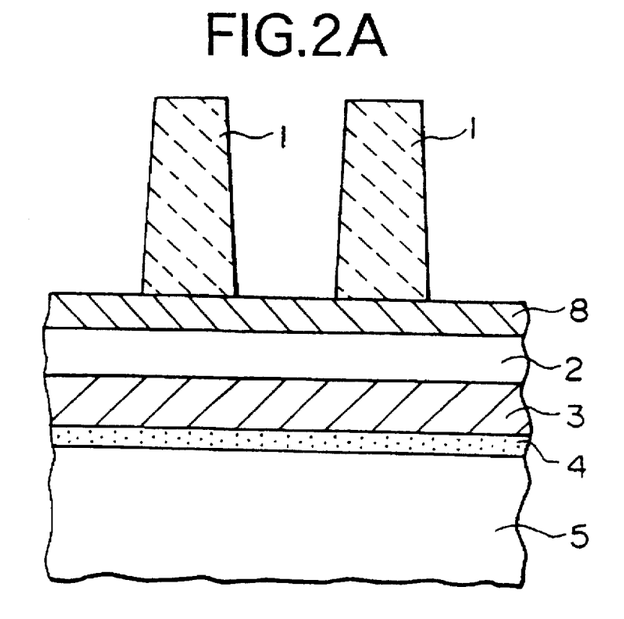
Figure 2B:
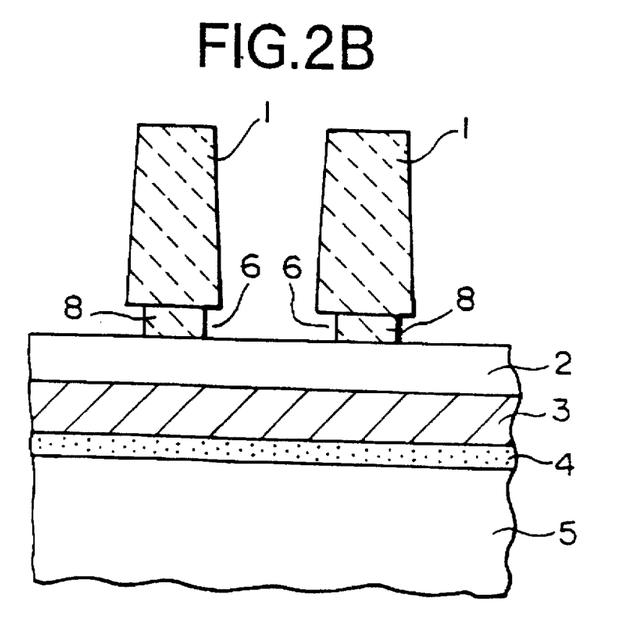
Figure 2C:
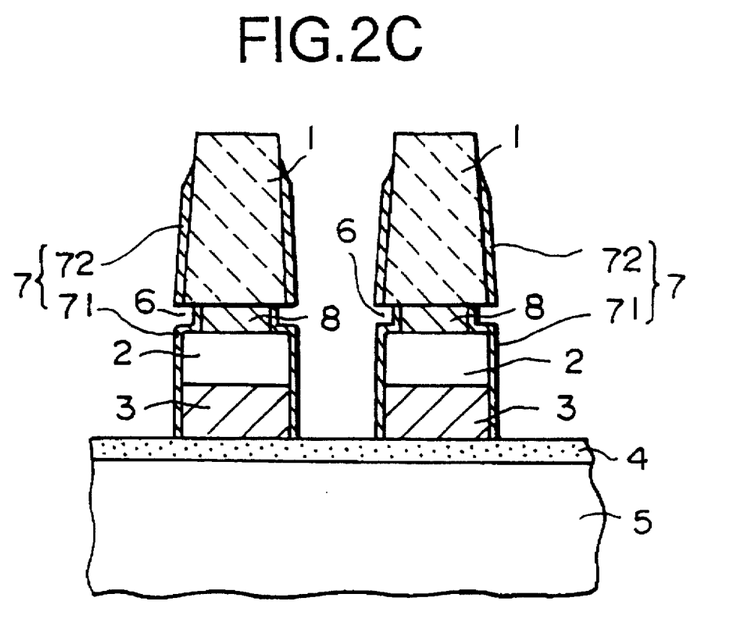

Also, this embodiment, as shown in FIG. 2A–2D, is a dry etching method for processing a polycide layer, in which a poly Si layer 3 and a refractory metal silicide layer 2 are formed in this order on an oxide film bed 4, by etching resist patterns 1 selectively formed on said polycide layer into a mask, wherein side wall protection films 7 for achieving anisotropic etching are formed on side faces of the layers 2 and 3 to be etched and at the same time a first side wall protection film 71 formed on the side faces of the layers 2 and 3 to be etched and a second side wall protection film 72 formed on a side face of the resist pattern 1 are separated at a point of time when the etching process ends as shown in FIG. 2C.

In this embodiment, a poly Si layer 8 with impurities doped at a higher density than in the lower layer is formed in the utmost top layer of a layer for forming a gate electrode thereon, so that an undercut is easily generated in the upmost top layer in dry etching the gate electrode. With this operation, a side wall protection film made of a reaction product deposited on a side wall of a resist mask in the etching process can easily be removed in removing the resist by means of ashing as well as in cleaning and drying the product.

In this embodiment, as shown in FIG. 2A, at first the substrate 5 (Si wafer substrate) is thermally oxidized in a batch diffusion furnace to form the gate oxide film bed 4 on the Si wafer substrate. Thickness of the gate oxide film bed 4 is, for instance, 10 nm. To achieve the purpose, an n$^+$ poly Si layer 3 having the thickness of, for instance, 100 nm is formed on the gate oxide film bed 4 with an LPCVD system. The conditions employable in this step for forming the oxide film bed are as shown below.

(Conditions for forming a film with a CVD system)
SiH$_4$=400 sccm
PH$_3$ (SiH$_4$ base 0.5%): 100 sccm
Pressure: 40 Pa
Temperature: 550° C.

Then, a WSix film having the thickness of, for instance, 100 nm is formed as the heavy metal silicide layer 2 on the gate oxide film bed/n$^+$ poly Si layer. The conditions for forming the film employable in this process are as shown below.

(Conditions for forming a WSix layer)
SiH$_4$=1000 sccm
WF$_6$:10 sccm
Pressure: 26.6 Pa
Temperature: 360° C.

After the gate oxide film bed 4, the lower poly Si layer 3, and the WSix layer 2 are formed, the upper poly Si layer 8 doped with impurities at a higher density than in the lower poly Si layer 3 is formed at the thickness of, for instance, 50 nm under the following conditions. It should be noted that an LPCVD system is used as a film forming system.

SiH$_4$=400 sccm
PH$_3$ (SiH$_4$ base 0.5%): 200 sccm
Pressure: 300 mTorr (40 Pa)
Temperature: 550° C.

Then, a resist layer for forming patterns is formed by using, for instance, a posi-type resist on the upper poly Si layer doped with impurities, and the resist layer is exposed to light, electron beam, or X ray and then is developed. With this operation, the photoresist pattern 1 is formed. It should be noted that, if the upper poly Si layer 8 is formed with an appropriate thickness to a light source for i ray, G ray, or excimer laser light, the layer 8 can also function as a reflection preventing film required when fine patterns are formed.

Then, the upper poly Si layer 8 is processed by means of dry etching with an ECR plasma etching system under the following conditions.

(Conditions for etching a poly Si layer containing impurities at a high density)
SF$_6$/HBr: 20/30 sccm
RF output: 70 W
Pressure: 1.3 Pa
μ wave power: 850 W
Stage temperature: 20° C.

As the upper poly Si layer 2 has been doped with P at a high density, namely at a weight % of, for instance, 2.5%, etching proceeds smoothly, and the undercut 6 is formed as shown in FIG. 2B.

After the upper poly Si layer containing impurities at a high density is etched, the etching conditions are changed to etch the silicide layer 2 (WSix layer) and the lower poly Si layer 3. The conditions are as shown below.

(Etching conditions)
SF$_6$/HBr=20/30 sccm
RF output: 1.3 Pa
Pressure: 1.3 Pa
μ wave power: 850 W
Stage temperature: 20° C.

Furthermore, for over-etching the stepped section, continuous etching is carried out under the following conditions.

HBr=50 sccm
RF output: 30 W
Pressure: 1.3 Pa
μ wave power: 850 W

Stage temperature: 20° C.

With this operation, the silicide layer 2 and the poly Si layer 3 are anisotropically processed as shown in FIG. 2C. Then, reaction products generated during etching such as, for instance, SiBrx or WBrx are deposited as the side wall protection film 7 on the side wall section of the resist mask and the side wall section of the gate electrode.

Finally, after the etching process is over, the photoresist mask, which is now unnecessary, is removed under the following conditions by means of ashing with a plasma ashing system.

$O_2$=300 sccm

Pressure: 160 Pa

μ wave power: 850 W

Figure 2D:
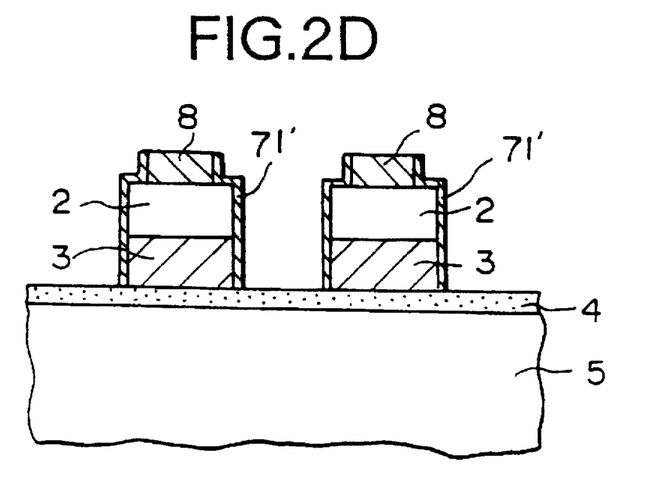
–FIG. 2D is a drawing illustrating a sequential order of processes in the embodiment 3.

Then, as the upper poly Si layer 8 containing impurities at a high density has already been etched so that an undercut can easily be generated, the product can be processed into the form as shown in FIG. 2D by means of cleaning with pure water and drying.

Embodiment 4

In this embodiment, at first the gate oxide film bed 4 is formed on an Si wafer substrate by means of thermally oxidizing the Si wafer substrate 5 with a heat diffusion furnace based on a batch system as shown in FIG. 2A. Then, the thickness of the gate oxide film bed 4 is, for instance, 10 nm. An $n^+$ poly Si layer having the thickness of, for instance, 100 nm, is formed on the gate oxide film bed with an LPCVD system. The conditions for forming the film employable in this process are as shown below.

(Conditions for forming a Si layer)

$SiH_4$=400 sccm $PH_3$ ($SiH_4$ base 0.5%): 100 sccm

Pressure: 40 Pa

Temperature: 350° C.

Then, a WSix layer having the thickness of, for instance, 100 nm is formed as the silicide layer 2 on the lower poly Si layer 3. The conditions for this operation are as shown below.

(Conditions for forming a WSix layer)

$SiH_4$=1000 sccm $WF_6$: 10 sccm

Pressure: 26.6 Pa

Temperature: 360° C.

After the gate oxide film bed 4, the lower poly Si layer 3, and the upper silicide layer 2 are formed, the upper poly Si layer doped with impurities at a higher density than in the lower poly Si layer and having the thickness of, for instance, 50 nm is formed under the following conditions with an LPCVD system.

(Conditions for forming a poly Si layer containing impurities at a high density)

$SiH_4$=400 sccm $PH_3$ ($SiH_4$ base 0.5%): 300 sccm

Pressure: 40 Pa

Pressure: 350° C.

Then, the upper poly Si layer 8, the WSIx layer 2, and the lower poly Si layer 3 are etched under the following conditions.

(Etching conditions)

$Cl_2$=35 sccm

HBr: 15 sccm

RF power: 50 W

Pressure: 1.3 Pa

μ wave power: 850 W

Then, as the upper poly Si layer 8 has been doped with P of 3.0 weight % or more, etching proceeds smoothly, and the undercut 6 is generated during the etching process. In contrast to it, the lower poly SI layer is doped at the weight % of around 1.2, so that an undercut like that in the upper poly Si layer 8 is not generated. For this reason, the side wall protection film 7 being etched is deposited as shown in FIG. 2C.

Finally, like in the embodiment 3, the photoresist mask is removed by means of $O_2$ plasma ashing, and then is cleaned and dried.

What is claimed is:

1. A dry etching method of processing a polycide layer, comprising the steps of:

forming a polycide layer on an oxide layer, the polycide layer being comprised of a first polysilicon layer and a refractory metal silicide layer in this order;

forming a poly Si layer film with impurities doped at a higher density than in the first polysilicon layer on the refractory metal silicide layer;

forming a patterned resist on said poly Si layer film;

providing an undercut in said poly Si layer film which contacts the patterned resist; and performing an anisotropic etching of said polycide layer using said patterned resist as a mask wherein a gas used in said anisotropic etching includes Br.

2. A dry etching method, comprising the steps of:

forming a polycide layer on an oxide layer, the polycide layer being comprised of a first polysilicon layer and a refractory metal silicide layer in this order;

forming a thin second polysilicon layer having higher doped impurity compared to said first polysilicon layer, on said refractory metal silicide layer;

forming a patterned resist on said thin polycide layer;

providing an undercut in said thin second polysilicon layer;

performing an anisotropic etching of said polycide layer using said patterned resist as a mask.

3. A dry etching method as claimed in claim 2 wherein said oxide layer is formed on a Si substrate with said first polysilicon layer and said refractory metal silicide layer formed on said oxide layer to form a polycide layer as a whole, and said step of providing an undercut is further defined as carrying out a first step etching with an ECR plasma etching system to provide said undercut in a portion corresponding to a section beneath the patterned resist, and said step of performing an anisotropic etching is further defined as carrying out a second etching step and a third step etching, which is over-etching, by anisotropically processing the remaining refractory metal silicide layer and the first polysilicon layer, and at the same time under the condition where an appropriate selection ratio is ensured during overetching removing the patterned resist, and comprising a final step of cleaning and drying the semiconductor wafer using a spin cleaning device.

4. A dry etching method as claimed in claim 3 wherein the gas used in the first etching step is $SF_6$.

5. A dry etching method as claimed in claim 3 wherein the gas used in the second etching step is selected from the group consisting of $SF_6$/HBr, $CL_2/O_2$, and $Cl_2$/HBr.

6. A dry etching method as claimed in claim 3 wherein the gas used in the third etching step is $O_2$/HBr.

7. A dry etching method for processing a polycide layer, in which a poly Si layer and a refractory metal silicide layer are formed in this order on an oxide film bed, by etching resist patterns selectively formed on said polycide layer; characterized in that first and second side wall protection films formed during anisotropic etching are formed on a side face of the poly Si layer and refractory metal silicide layer to be etched and on a side face of the resist patterns respectively, and said first and second protection films are separated at a point of time when etching ends.

8. A dry etching method for processing a polycide layer, in which a poly Si layer and a refractory metal silicide layer are formed in this order on an oxide film bed, by etching resist patterns selectively formed on said polycide layer; wherein first and second side wall protection films formed during anisotropic etching are formed on a side face of the poly Si layer and the refractory metal silicide layer to be etched and on a side face of the resist patterns respectively, and said first and second protection films are separated at a point of time when etching ends, and also that the first and second protection films are removed after etching ends.

9. A dry etching method as claimed in one of claims 7 or 8 wherein a poly Si layer film with impurities doped at a higher density as compared to that in said poly Si layer is formed on the refractory metal silicide layer so that an undercut is generated in this poly Si layer film in dry-etching a gate electrode.

10. A dry etching method comprising steps of forming an oxide film bed by thermally oxidizing a Si substrate, forming an $n^+$ poly Si layer on said gate oxide film bed with an LPCVD system, forming a refractory metal silicide layer on the gate oxide film bed/$n^+$ poly Si layer, forming a top poly Si layer with impurities doped at a higher density as compared to that in said $n^+$ poly Si layer after forming the said gate oxide film bed, said $n^+$ poly Si layer and silicide layer, then forming a photoresist pattern on said top poly Si layer, dry-etching the top poly Si layer with an ECR plasma etching system to form an undercut therein, etching the silicide layer and said $n^+$ poly Si layer changing the etching conditions after etching the aforesaid top poly Si layer, furthermore removing a photoresist mask by ashing with a plasma ashing system after overetching a step section, and finally cleaning with pure water and drying the semiconductor wafer.

11. A dry etching method as claimed in one of claims 7 or 8 characterized in that removal of the side wall protection films is carried out according to the ashing technology.

12. A dry etching method as claimed in claims 7 or 8 characterized in that removal of the side wall protection films is carried out by means of cleaning with water.

13. A dry etching method as claimed in claim 2 wherein said polycide layer to be etched has a stacking structure for forming a silicon-based electrode layer.

14. A dry etching method of processing a polycide layer, comprising the steps of:

forming a polycide layer on an oxide layer, the polycide layer being comprised of a first polysilicon layer and a refractory metal silicide layer in this order;

forming a patterned resist on said polycide layer;

providing an undercut in said refractory metal silicide layer which contacts the patterned resist; and performing an anisotropic etching of said polycide layer using said patterned resist as a mask.

Wherein a poly Si layer film with impurities doped at a higher density as compared to that in said poly Si layer is formed on the refractory metal silicide layer so that an undercut is generated in this poly Si layer film in dry-etching a gate electrode.

15. A dry etching method as claimed in claim 2 wherein the gas used in the second etching step is selected from the group consisting of $SF_6$/HBr, $CL_2/O_2$, and $Cl_2$/HBr.

16. A dry etching method as claimed in claim 4 wherein the gas used in the second etching step is selected from the group consisting of $SF_6$/HBr, $CL_2/O_2$, and $Cl_2$/HBr.

* * * * *